US011360393B2

(12) United States Patent
Wylie-Van Eerd et al.

(10) Patent No.: US 11,360,393 B2
(45) Date of Patent: Jun. 14, 2022

(54) MIRROR, IN PARTICULAR FOR A MICROLITHOGRAPHIC PROJECTION EXPOSURE SYSTEM

(71) Applicant: Carl Zeiss SMT GmbH, Oberkochen (DE)

(72) Inventors: Ben Wylie-Van Eerd, Hataitai Wellington (NZ); Frederik Bijkerk, Bosch en Duin (NL); Kerstin Hild, Schwaebisch Gmuend (DE); Toralf Gruner, Aalen (DE); Stefan Schulte, Lauchheim (DE); Simone Weyler, Heidenheim (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 131 days.

(21) Appl. No.: 16/786,232

(22) Filed: Feb. 10, 2020

(65) Prior Publication Data

US 2020/0174379 A1    Jun. 4, 2020

Related U.S. Application Data

(63) Continuation of application No. PCT/EP2018/070157, filed on Jul. 25, 2018.

(30) Foreign Application Priority Data

Aug. 9, 2017  (DE) .................... 10 2017 213 900.5

(51) Int. Cl.
  *G03F 7/20*    (2006.01)
  *G02B 5/08*    (2006.01)
  *G02B 26/08*   (2006.01)
(52) U.S. Cl.
  CPC ....... *G03F 7/70266* (2013.01); *G02B 5/0816* (2013.01); *G02B 26/0816* (2013.01); *G03F 7/70316* (2013.01)

(58) Field of Classification Search
None
See application file for complete search history.

(56) References Cited

U.S. PATENT DOCUMENTS

| 2014/0285783 A1 | 9/2014 | Dinger et al. |
| 2016/0209751 A1 | 7/2016 | Gruner et al. |
| 2018/0164581 A1 | 6/2018 | Hakvoort et al. |

FOREIGN PATENT DOCUMENTS

| DE | 102011005940 A1 | 9/2012 |
| DE | 102011081603 A1 | 10/2012 |

(Continued)

OTHER PUBLICATIONS

International Search Report, PCT/EP2018/070157, dated Nov. 15, 2018, 4 pages.

(Continued)

*Primary Examiner* — Michelle M Iacoletti
(74) *Attorney, Agent, or Firm* — Edell, Shapiro & Finnan, LLC (57) ABSTRACT

A mirror having a mirror substrate (12, 32, 52), a reflection layer stack (21, 41, 61) reflecting electromagnetic radiation having an operating wavelength that is incident on the optical effective surface (11, 31, 51), and at least one piezoelectric layer (16, 36, 56), arranged between the substrate and the reflection layer stack and to which an electric field producing a locally variable deformation is applied. A first electrode arrangement (20, 40, 60) situated on the side of the piezoelectric layer faces the reflection layer stack, and a second electrode arrangement (14, 34, 54) is situated on the side of the piezoelectric layer facing the mirror substrate. Optionally, a bracing layer (98) is provided, which limits sinking of the piezoelectric layer (96) into the mirror substrate (92) when an electric field is applied, in comparison with an analogous construction lacking the bracing layer, (Continued)

thereby increasing the piezoelectric layer's effective deflection.

20 Claims, 9 Drawing Sheets

(56) References Cited

FOREIGN PATENT DOCUMENTS

| | | |
|---|---|---|
| DE | 102011077234 A1 | 12/2012 |
| DE | 102011084649 A1 | 4/2013 |
| DE | 102013219583 A1 | 4/2015 |
| DE | 102015213273 A1 | 1/2017 |
| DE | 102015213275 A1 | 1/2017 |
| DE | 102016224202 A1 | 1/2017 |
| DE | 102017203647 A1 | 9/2018 |
| WO | 2013057046 A1 | 4/2013 |

OTHER PUBLICATIONS

International Preliminary Report on Patentability and the Written Opinion, PCT/EP2018/070157, dated Feb. 11, 2020, 9 pages.
Bayraktar et al., "Nanosheet controlled epitaxial growth of PbZr0.52Ti0.48O3 thin films on glass substrates", Applied Physics Letters, (Oct. 1, 2014), 5 pages.
German Office Action with English translation, Application No. 10 2017 213 900, dated Mar. 27, 2018, 18 pages.

Prior art

Fig. 9

MIRROR, IN PARTICULAR FOR A MICROLITHOGRAPHIC PROJECTION EXPOSURE SYSTEM

CROSS REFERENCE TO RELATED APPLICATIONS

This is a Continuation of International Application PCT/EP2018/070157, which has an international filing date of Jul. 25, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 213 900.5 filed on Aug. 9, 2017.

FIELD OF THE INVENTION

The invention relates to a mirror, in particular for a microlithographic projection exposure apparatus, and to a method for producing same.

BACKGROUND

Microlithography is used for production of microstructured components, for example integrated circuits or LCDs. The microlithography process is conducted in what is called a projection exposure apparatus, which comprises an illumination device and a projection lens. The image of a mask (=reticle) illuminated by the illumination device is projected here by the projection lens onto a substrate (e.g. a silicon wafer) coated with a light-sensitive layer (photoresist) and disposed in the image plane of the projection lens, in order to transfer the mask structure to the light-sensitive coating of the substrate.

In projection lenses designed for the extreme ultraviolet (EUV) range, i.e. at wavelengths of e.g. approximately 13 nm or approximately 7 nm, owing to the lack of availability of suitable light-transmissive refractive materials, mirrors are used as optical components for the imaging process.

In this case, it is also known to configure one or more mirrors in an EUV system as an adaptive mirror with an actuator layer composed of a piezoelectric material, wherein an electric field having a locally varying strength is generated across this piezoelectric layer by an electrical voltage being applied to electrodes arranged on both sides with respect to the piezoelectric layer. In the case of a local deformation of the piezoelectric layer, the reflection layer stack of the adaptive mirror also deforms, with the result that e.g. (possibly also temporally variable) imaging aberrations are compensated for at least in part by suitably driving the electrodes.

Figure 8:
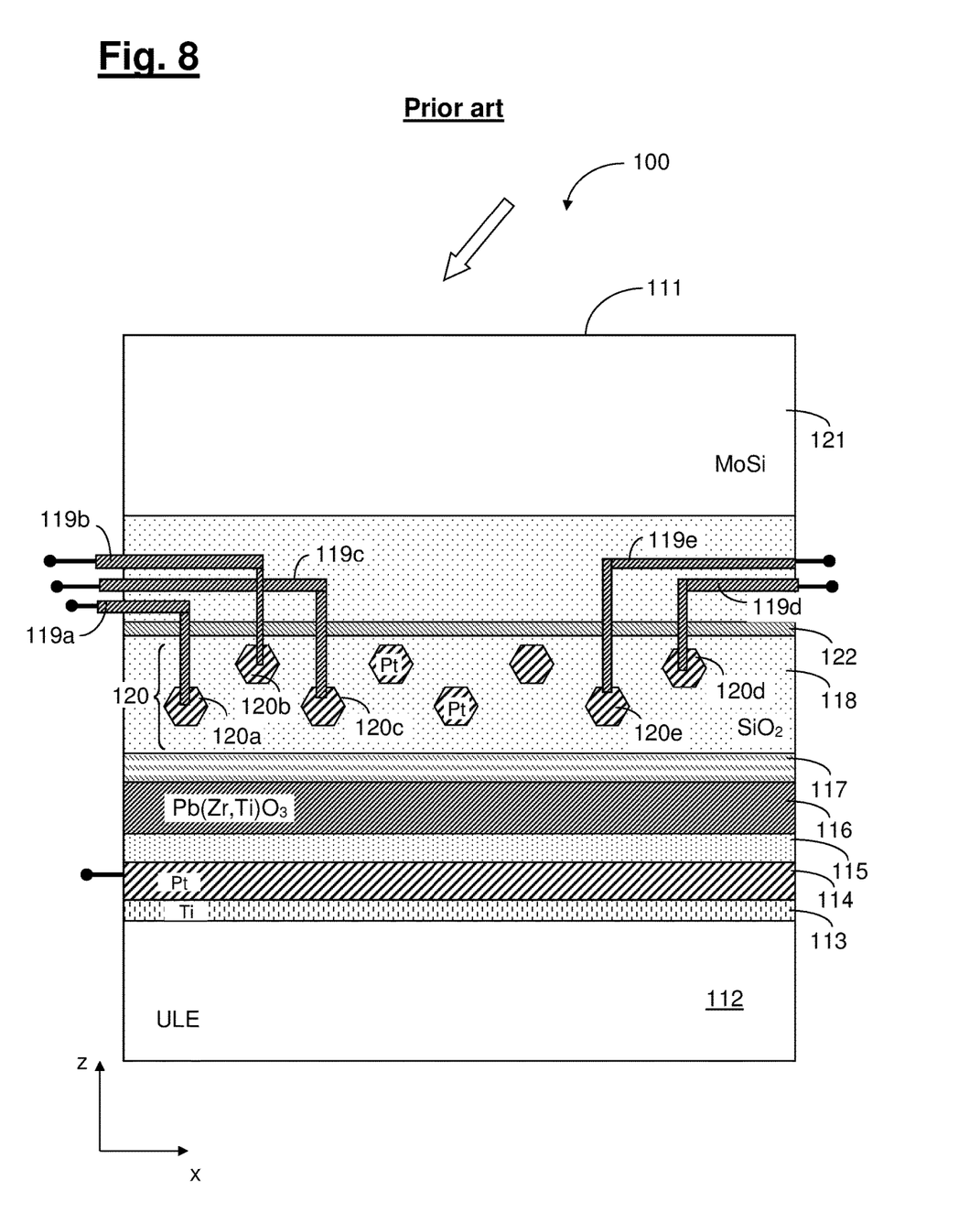
FIG. 8 shows a schematic illustration for describing the possible construction of a conventional adaptive mirror.

FIG. 8 shows, in a schematic illustration, a conventional construction of a mirror 100 comprising a mirror substrate 112 and a reflection layer stack 121. The mirror 100 is of adaptive design and for this purpose comprises a piezoelectric layer 116 (e.g. composed of lead zirconate titanate (Pb(Zr,Ti)O$_3$, PZT)). Electrode arrangements 114, 120 are respectively situated above and below the piezoelectric layer 116, by way of which electrode arrangements an electric field for producing a locally variable deformation is able to be applied to the mirror 100. The second electrode arrangement 114 facing the substrate 112 is configured as a continuous, planar electrode of constant thickness, whereas the first electrode arrangement 120 comprises a plurality of electrodes 120a, 120b, 120c, . . . , to which an electrical voltage relative to the first electrode arrangement 114 is able to be applied respectively via a supply line 119a, 119b, 119c, . . . .

The electrodes 120a, 120b, 120c, . . . are embedded into a smoothing layer 118 produced from quartz (SiO$_2$), said smoothing layer serving for leveling the electrode arrangement 120. Furthermore, the mirror 100 comprises an adhesion layer 113 (e.g. composed of titanium, Ti) and also a buffer layer 115 between the mirror substrate 112 and the bottom electrode 114 facing the mirror substrate 112.

During operation of an optical system comprising the mirror 100, applying an electrical voltage to the electrode arrangements 114 and 120 by way of the electric field that forms in the region of the piezoelectric layer 116 results in a deflection of said piezoelectric layer 116. In this way, it is possible (for instance for the compensation of optical aberrations e.g. owing to thermal deformations in the case of EUV radiation incident on the optical effective surface 111) to achieve an actuation of the mirror 100. A mediator layer 117 is in direct electrical contact with the electrodes 120a, 120b, 120c, . . . (which are illustrated in plan view in FIG. 1 only for purposes of explanation) and serves to "mediate" a potential between the electrodes 120a, 120b, 120c, . . . of the electrode arrangement 120 within the piezoelectric layer 116, wherein said mediator layer has only a low electrical conductivity (e.g. less than 200 siemens/meter (S/m)) with the consequence that a potential difference existing between adjacent electrodes 120a, 120b, 120c, . . . is dropped substantially across the mediator layer 117 and thus also in the piezoelectric material between the electrodes.

During the production of the adaptive mirror 100, ensuring that the reflection layer stack 121 is applied while complying with the required specifications is a demanding challenge. One problem that occurs here in practice is, in particular, during the fabrication process before the reflection layer system is applied, that of realizing interferometric measurements of the respective surface-processed layer without the measurement being influenced by the metallic structures of the electrode arrangement 120 and by the piezoelectric layer 116, since such influencing would result in a corruption of the interferometric measurement results and thus an inadequate usability for the material removals to be carried out in each case in the fabrication process.

Regarding the prior art, reference is made merely by way of example to DE 10 2015 213 273 A1.

SUMMARY

It is an object of the present invention to provide a mirror, in particular for a microlithographic projection exposure apparatus, and a method for producing same which make it possible to realize the highest possible surface quality while complying with the specifications required e.g. in the EUV range.

This object is achieved in accordance with the features of the independent patent claims.

In accordance with one aspect of the invention, a mirror according to the invention comprises:
  an optical effective surface;
  a mirror substrate;
  a reflection layer stack for reflecting electromagnetic radiation having an operating wavelength that is incident on the optical effective surface; and
  at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate;

wherein a multifunctional layer system is provided, which, with the embedding of the first electrode arrangement, enables a smoothing surface processing and secondly has a transmission of less than $10^{-6}$ for electromagnetic radiation having a test wavelength in order to enable a surface-interferometric measurement.

Here and hereinafter, the term "transmission" should be understood as transmission with double passage (after reflection of the relevant electromagnetic radiation) through the layer being processed in order to achieve the required surface quality.

The present invention is based on the concept, in particular, in an adaptive mirror comprising a piezoelectric layer, to which electrical voltage is able to be applied by way of electrode arrangements, of making it possible to realize a high surface quality while complying with the specifications required in the EUV range by virtue of the fact that the mirror is equipped with a multifunctional layer system which, over and above the conventionally customary embedding of the electrodes, also enables a surface-interferometric measurability, the last-mentioned effect being achieved by the provision of a sufficiently low transmission for electromagnetic radiation having the respective test wavelength.

In other words, the multifunctional layer system according to the invention does not just satisfy the requirements in respect of smoothability and electrical insulation of the electrodes from one another, but at the same time prevents, during the fabrication process, the occurrence of the influences or corruptions—described in the introduction—of the measurement results obtained during the interferometric measurement of the respective surface-processed layer by the metallic structures of the electrode arrangement and by the piezoelectric layer.

In particular, the invention does not just involve the use of a smoothing layer in the form of amorphous quartz ($SiO_2$) for embedding the electrodes, rather depending on the embodiment, as described below, either a suitable manipulation of said smoothing layer by corresponding doping or the addition of at least one further layer is effected in order to ensure that the abovementioned metallic structures of the electrode arrangement and of the piezoelectric layer are "not visible" during the interferometric measurement.

In the context of the present application, the term "multifunctional layer system" is intended to encompass both configurations comprising just a single layer that fulfills all functions described above (i.e. smoothing, electrical insulation and ensuring the interferometric measurability), and configurations in which said functions are performed by two or more layers.

In accordance with one embodiment, the multifunctional layer system has a transmission of less than $10^{-7}$, in particular of less than $10^{-8}$, more particularly of less than $10^{-9}$, for electromagnetic radiation having the test wavelength.

In accordance with one embodiment, the multifunctional layer system comprises a layer composed of doped quartz glass ($SiO_2$).

In accordance with one embodiment, the multifunctional layer system comprises a layer composed of amorphous silicon (a-Si).

In accordance with one embodiment, the mirror comprises a bracing layer, which reduces a sinking of the piezoelectric layer into the mirror substrate accompanying the application of an electric field in comparison with an analogous construction without the bracing layer and thus increases the effective deflection of the piezoelectric layer.

In accordance with one embodiment, the bracing layer comprises quartz glass ($SiO_2$).

The above effect achieved by the bracing layer is also advantageous independently of the presence of the multifunctional layer system described above. In accordance with a further aspect, therefore, the invention also relates to a mirror, wherein the mirror comprises an optical effective surface, comprising
  a mirror substrate;
  a reflection layer stack for reflecting electromagnetic radiation having an operating wavelength that is incident on the optical effective surface;
  at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate; and
  a bracing layer, which reduces a sinking of the piezoelectric layer into the mirror substrate accompanying the application of an electric field in comparison with an analogous construction without the bracing layer and thus increases the effective deflection of the piezoelectric layer.

In accordance with one embodiment, the bracing layer has a thickness of at least 10 µm, more particularly of at least 15 µm, and more particularly of at least 30 µm.

In accordance with one embodiment, the mirror is designed for an operating wavelength of less than 30 nm, in particular less than 15 nm.

In accordance with one embodiment, the mirror is a mirror for a microlithographic projection exposure apparatus.

In accordance with a further aspect, the invention also relates to a method for producing a mirror, wherein the method comprises the following steps:
  providing a mirror substrate;
  applying a piezoelectric layer and also a first and a second electrode arrangement on the mirror substrate, wherein an electric field for producing a locally variable deformation is able to be applied to the piezoelectric layer by way of the first electrode arrangement situated on the side of the piezoelectric layer facing away from the mirror substrate, and by way of the second electrode arrangement situated on the side of the piezoelectric layer facing the mirror substrate;
  wherein the first electrode arrangement is embedded in a multifunctional layer system, which firstly enables a smoothing surface processing and secondly has a transmission of less than $10^{-6}$ for electromagnetic radiation having the test wavelength in order to enable a surface-interferometric measurement; and
  applying a reflection layer stack for reflecting electromagnetic radiation having an operating wavelength that is incident on the optical effective surface.

In accordance with one embodiment, the multifunctional layer system comprises a layer composed of quartz glass ($SiO_2$).

In accordance with one embodiment, the multifunctional layer system comprises an absorbent layer, in particular composed of carbon (C).

In accordance with one embodiment, said absorbent layer is removed in each case before the reflection layer stack is applied, in particular after a surface-interferometric measurement is respectively carried out.

In accordance with one embodiment, the multifunctional layer system comprises a layer composed of doped quartz glass ($SiO_2$).

In accordance with one embodiment, the multifunctional layer system comprises a layer composed of amorphous silicon (a-Si).

The mirror can be in particular a mirror for a microlithographic projection exposure apparatus. However, the invention is not limited thereto. In other applications, a mirror according to the invention can also be employed or utilized for example in an apparatus for mask metrology.

In accordance with one embodiment, the mirror is designed for an operating wavelength of less than 30 nm, in particular less than 15 nm. However, the invention is not limited thereto, and the invention can therefore also be realized advantageously in further applications in an optical system having an operating wavelength in the VUV range (for example of less than 200 nm).

The invention furthermore relates to an optical system, in particular an illumination device or a projection lens of a microlithographic projection exposure apparatus, comprising at least one mirror having the features described above, and also to a microlithographic projection exposure apparatus.

Further configurations of the invention can be gathered from the description and the dependent claims.

The invention is explained in greater detail below on the basis of exemplary embodiments illustrated in the accompanying figures.

DETAILED DESCRIPTION

Figure 1:
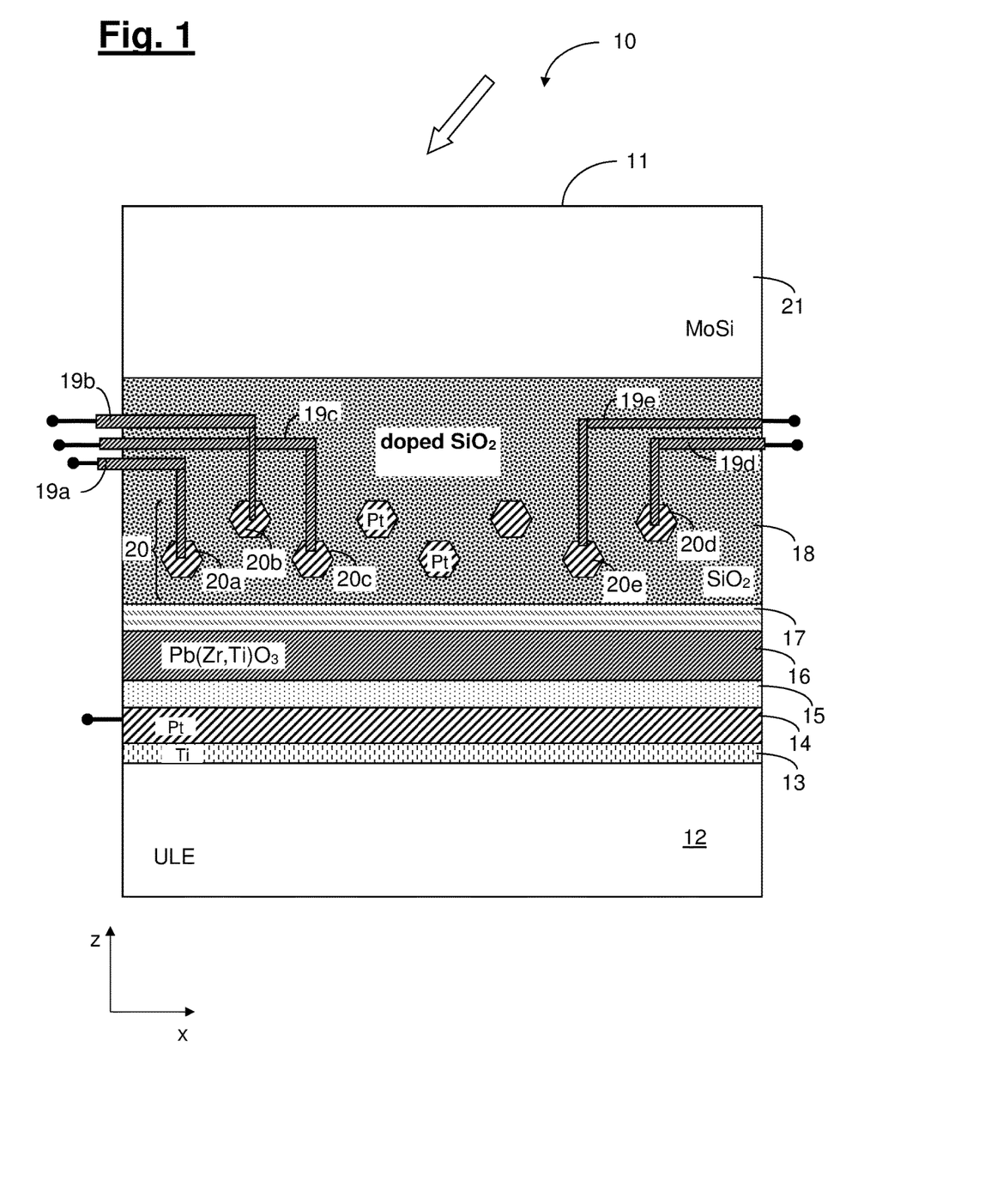
FIG. 1 shows a schematic illustration for describing the construction of an adaptive mirror in accordance with one embodiment of the invention.

FIG. 1 shows a schematic illustration for describing the construction of a mirror according to the invention in one embodiment of the invention. The mirror 10 comprises in particular a mirror substrate 12, which is produced from any desired suitable mirror substrate material. Suitable mirror substrate materials are e.g. quartz glass doped with titanium dioxide ($TiO_2$), with materials that are usable being, merely by way of example (and without the invention being restricted thereto), those sold under the trade names ULE® (from Corning Inc.) or Zerodur® (from Schott AG).

Furthermore, the mirror 10 has, in a manner known per se in principle, a reflection layer stack 21, which, in the embodiment illustrated, comprises merely by way of example a molybdenum-silicon (Mo—Si) layer stack. Without the invention being restricted to specific configurations of this layer stack, one suitable construction that is merely by way of example can comprise approximately 50 plies or layer packets of a layer system comprising molybdenum (Mo) layers having a layer thickness of in each case 2.4 nm and silicon (Si) layers having a layer thickness of in each case 3.3 nm.

The mirror 10 can be in particular an EUV mirror of an optical system, in particular of the projection lens or of the illumination device of a microlithographic projection exposure apparatus.

The impingement of electromagnetic EUV radiation (indicated by an arrow in FIG. 1) on the optical effective surface 11 of the mirror 10 during operation of the optical system can lead to an inhomogeneous volume change of the mirror substrate 12 and a resultant shape change of the optical effective surface 11 on account of the temperature distribution which results from the absorption of radiation which impinges inhomogeneously on the optical effective surface 11. In order to correct such an undesired shape change of the optical effective surface 11 or else in order to correct other aberrations that occur during operation of the microlithographic projection exposure apparatus, the mirror 10 is of adaptive design, as is explained in greater detail below. For this purpose, the mirror 10 according to the invention comprises a piezoelectric layer 16, which in the exemplary embodiment is produced from lead zirconate titanate ($Pb(Zr,Ti)O_3$, PZT) and can have an exemplary thickness e.g. in the range of 1 μm to 2 μm. In further embodiments, the piezoelectric layer 16 can also be produced from some other suitable material (e.g. aluminum nitride (AlN), aluminum scandium nitride (AlScN) or lead magnesium niobate (PbMgNb)). The piezoelectric layer 16 can have for example a thickness of less than 5 μm, more particularly a thickness in the range of 1 μm to 2 μm.

In accordance with FIG. 1, electrode arrangements 14, 20 (produced from platinum in the exemplary embodiment) are respectively situated above and below the piezoelectric layer 16, by way of which electrode arrangements an electric field for producing a locally variable deformation is able to be applied to the mirror 10. Of said electrode arrangements 14, 20, the second electrode arrangement 14 facing the substrate 12 is configured as a continuous, planar electrode of constant thickness, whereas the first electrode arrangement 20 comprises a plurality of electrodes 20*a*, 20*b*, 20*c*, . . . , to which an electrical voltage relative to the first electrode arrangement 14 is able to be applied respectively via a supply line 19*a*, 19*b*, 19*c*, . . . .

In further embodiments, conversely with respect to FIG. 1, instead of the first electrode arrangement 20, the second electrode arrangement 14 can also be constructed from a plurality of electrodes and the first electrode arrangement can instead be configured as a continuously planar electrode.

Furthermore, the electrodes 20*a*, 20*b*, 20*c*, . . . have—without the invention being restricted thereto—a hexagonal geometry, wherein in particular they can also be arranged substantially over a wide area and in a manner isolated from one another only by way of comparatively narrow trenches. The invention is generally not restricted to specific geometries of the electrodes or distances therebetween (wherein the distance between the electrodes can also be e.g. a number of millimeters (mm) or a number of centimeters (cm)).

In accordance with FIG. 1, the supply lines 19a, 19b, 19c, ... each have a first section, which runs perpendicular to the stacking direction of the reflection layer stack 21, and a second section (also referred to as "via" or "plated-through hole"), which runs in the stacking direction of the reflection layer stack 21. Other types of contacting are also possible, wherein e.g. the supply lines in further embodiments can also be realized with just one section running perpendicular to the stacking direction (in a two-dimensional design and without "vias").

Furthermore, the mirror 10 according to FIG. 1 comprises an adhesion layer 13 (e.g. composed of titanium, Ti) between the mirror substrate 12 and the bottom electrode 14 facing the mirror substrate 12. Furthermore, "15" denotes a growth layer present between the electrode arrangement 14 facing the substrate 12 and the piezoelectric layer 16. Said growth layer 15 serves to provide as optimal crystalline growth conditions and control as possible for the piezoelectric layer and can be produced e.g. from $LaNiO_3$.

During operation of the mirror 10 or of an optical system comprising said mirror 10, applying an electrical voltage to the electrode arrangements 14 and 20 by way of the electric field that forms in the region of the piezoelectric layer 16 results in a deflection of said piezoelectric layer 16. In this way, it is possible (for instance for the compensation of optical aberrations e.g. owing to thermal deformations in the case of EUV radiation incident on the optical effective surface 11) to achieve an actuation of the mirror 10.

In the exemplary embodiment in FIG. 1, the mirror 10 furthermore comprises a mediator layer 17. Said mediator layer 17 is in direct electrical contact with the electrodes 20a, 20b, 20c, ... (which are illustrated in plan view in FIG. 1 only for purposes of explanation). Said mediator layer 17 as such does not constitute the claimed subject matter of the present invention and serves to "mediate" a potential between the electrodes 20a, 20b, 20c, ... of the electrode arrangement 20 within the piezoelectric layer, wherein said mediator layer has only a low electrical conductivity (preferably less than 200 siemens/meter (S/m)) with the consequence that a potential difference existing between adjacent electrodes 20a, 20b, 20c, ... is dropped substantially across the mediator layer 17. Even though the use of the mediator layer 17 in the adaptive mirror according to the invention is advantageous as described above, the invention is not restricted to the presence of such a mediator layer.

The electrodes 20a, 20b, 20c, ... are embedded into a multifunctional layer system 18, which in the exemplary embodiment in FIG. 1 is formed by a doped quartz ($SiO_2$) layer and serves for leveling the electrode arrangement 20. Said multifunctional layer system 18 does not just provide for smoothing and leveling the structures impressed on the overall layer stack by the structured electrodes 20 and by the supply lines 19, but rather moreover also provides for electrically insulating the supply lines 19a, 19b, 19c, ... from one another and, during the fabrication process of the mirror 10, for enabling an interferometric measurement without the measurement results being influenced by the metallic structures of the electrode arrangement 20 and by the piezoelectric layer 16. The doping of the quartz ($SiO_2$) layer that is formed for this purpose in accordance with FIG. 1 can comprise e.g. the incorporation of carbon (C) atoms, as a result of which the transmission for radiation having the respective test wavelength (which by way of example can be in the range of 400 nm-600 nm) is sufficiently reduced with the consequence that the underlying structures (electrode arrangement 20 and piezoelectric layer 16) mentioned above are no longer visible to the interferometric measurement.

As far as the abovementioned smoothing or the achievable surface roughness is concerned, exemplary suitable values of the surface roughness achievable in each case by methods such as robot polishing or ion beam figuring are preferably less than 0.2 nm RMS, more preferably less than 0.15 nm RMS in the spatial frequency range of 1 µm to 1 mm.

As far as the electrical insulation of the supply lines is concerned, the relevant layer or the multifunctional layer system 18 preferably has a surface conductivity of less than $1/(k\Omega \cdot m)$, in particular of less than $1/(M\Omega \cdot m)$.

Finally, as far as enabling the interferometric measurement is concerned, the relevant layer or the multifunctional layer system 18 preferably has a transmission of less than $10^{-9}$.

In embodiments, the multifunctional layer system 18 can also comprise a reflective layer having a reflectivity of preferably at least 10%, more preferably at least 30%, and more preferably at least 50%, for radiation having the respective operating wavelength.

The thickness of the doped quartz ($SiO_2$) layer forming the multifunctional layer system 18 can be in the range of (500-700) nm for example in the finished mirror. If a material removal to be realized during fabrication in the range of (600-800) nm is furthermore assumed by way of example, then this presupposes an initial thickness of the part to be smoothed of the multifunctional layer system 18 of at least 1300 nm.

Figure 2:
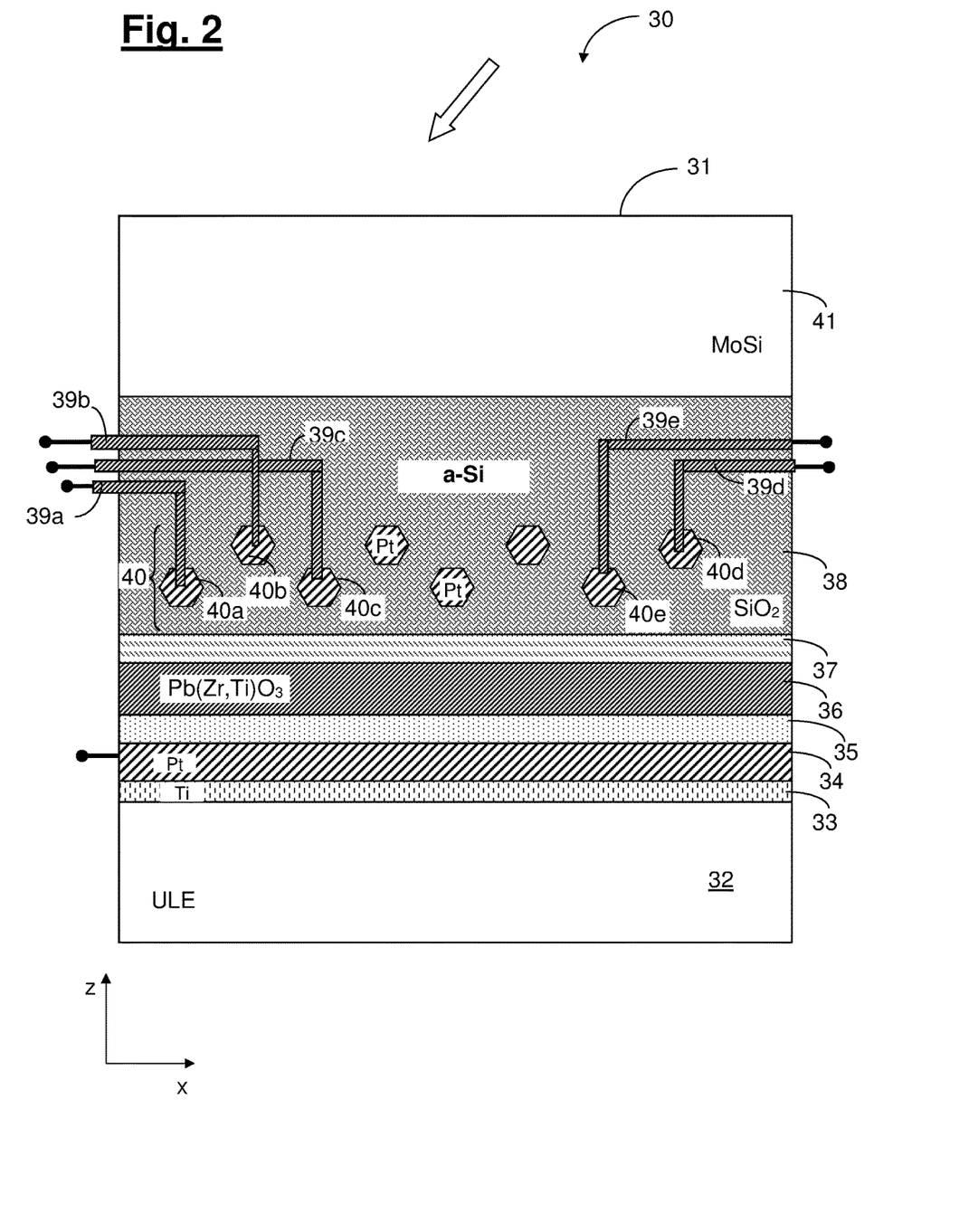
FIGS. 2-3 show schematic illustrations for describing the construction of an adaptive mirror in further embodiments of the invention.

FIG. 2 shows a further embodiment of the invention, wherein components which are analogous or have substantially the same function in comparison with the exemplary embodiment in FIG. 1 are designated by reference signs increased by "20".

In contrast to FIG. 1, in accordance with FIG. 2, the multifunctional layer system 38 is configured as an amorphous silicon layer, as a result of which the transmission reduction required for the interferometric measurability is likewise achieved. In order to ensure a sufficient electrical insulation, the amorphous silicon layer can have a suitable doping.

Figure 3:
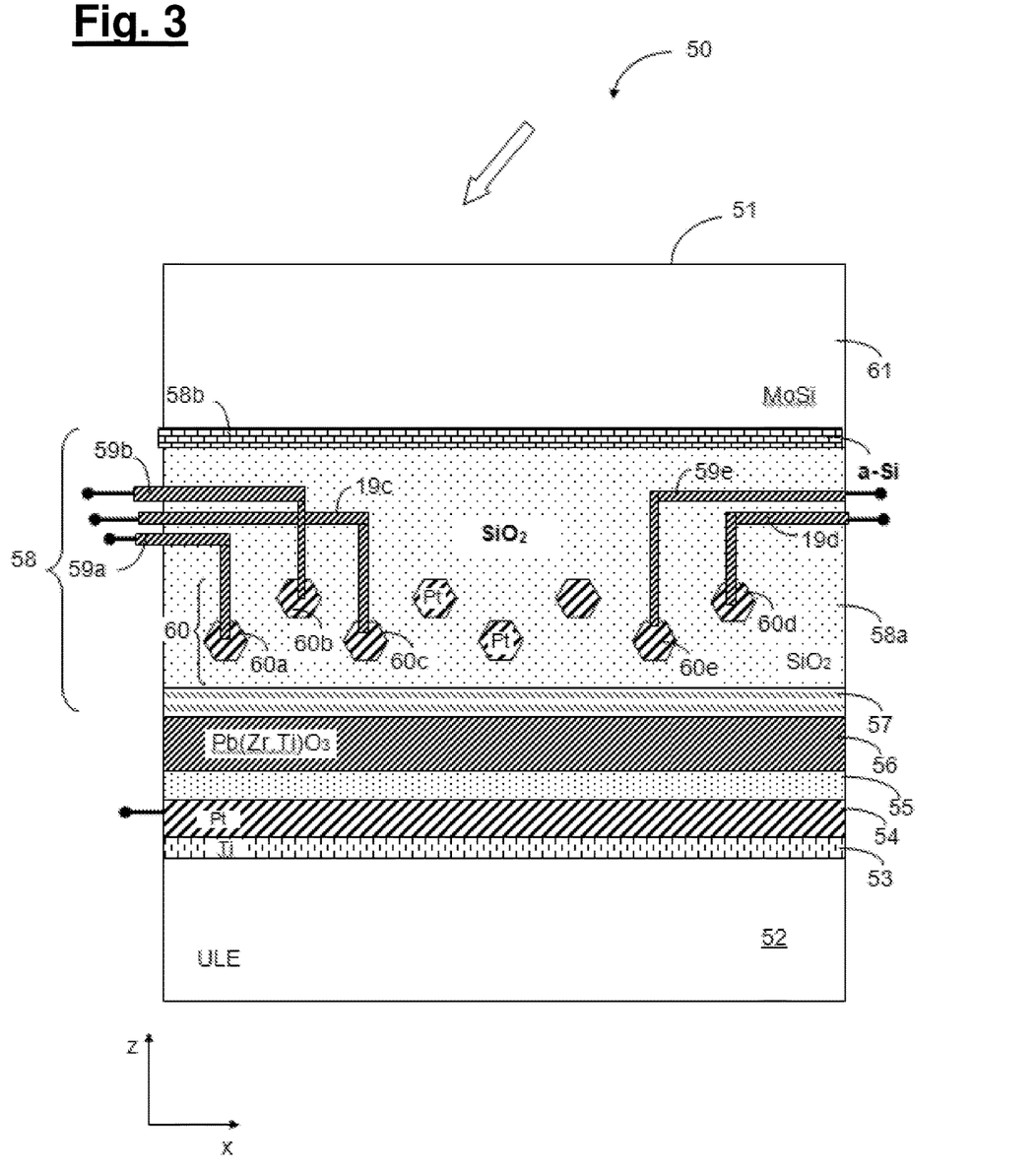

FIG. 3 shows a further embodiment of the invention, wherein components which are analogous or have substantially the same function in comparison with the exemplary embodiment in FIG. 2 are designated in turn by reference signs increased by "20".

In contrast to FIG. 1 and FIG. 2, in accordance with FIG. 3, the multifunctional layer system 58 comprises a layer stack composed of a quartz ($SiO_2$) layer 58a and an amorphous silicon layer 58b, wherein the transmission reduction required for the interferometric measurability is achieved with the amorphous silicon layer 58b. The quartz ($SiO_2$) layer 58a serves for smoothing and leveling the electrode arrangement 60 and for ensuring a sufficient electrical insulation of the supply lines 59a, 59b, 59c, ... from one another (and so the amorphous silicon layer 58b need no longer have an insulation effect). The smoothing level produced by the quartz ($SiO_2$) layer 58a is not impaired by the amorphous silicon layer 58b, and so overall a multifunctional layer system 58 having the three effects described above (smoothing, electrical insulation and transmission reduction or ensuring the interferometric measurability) is attained.

Figure 4:
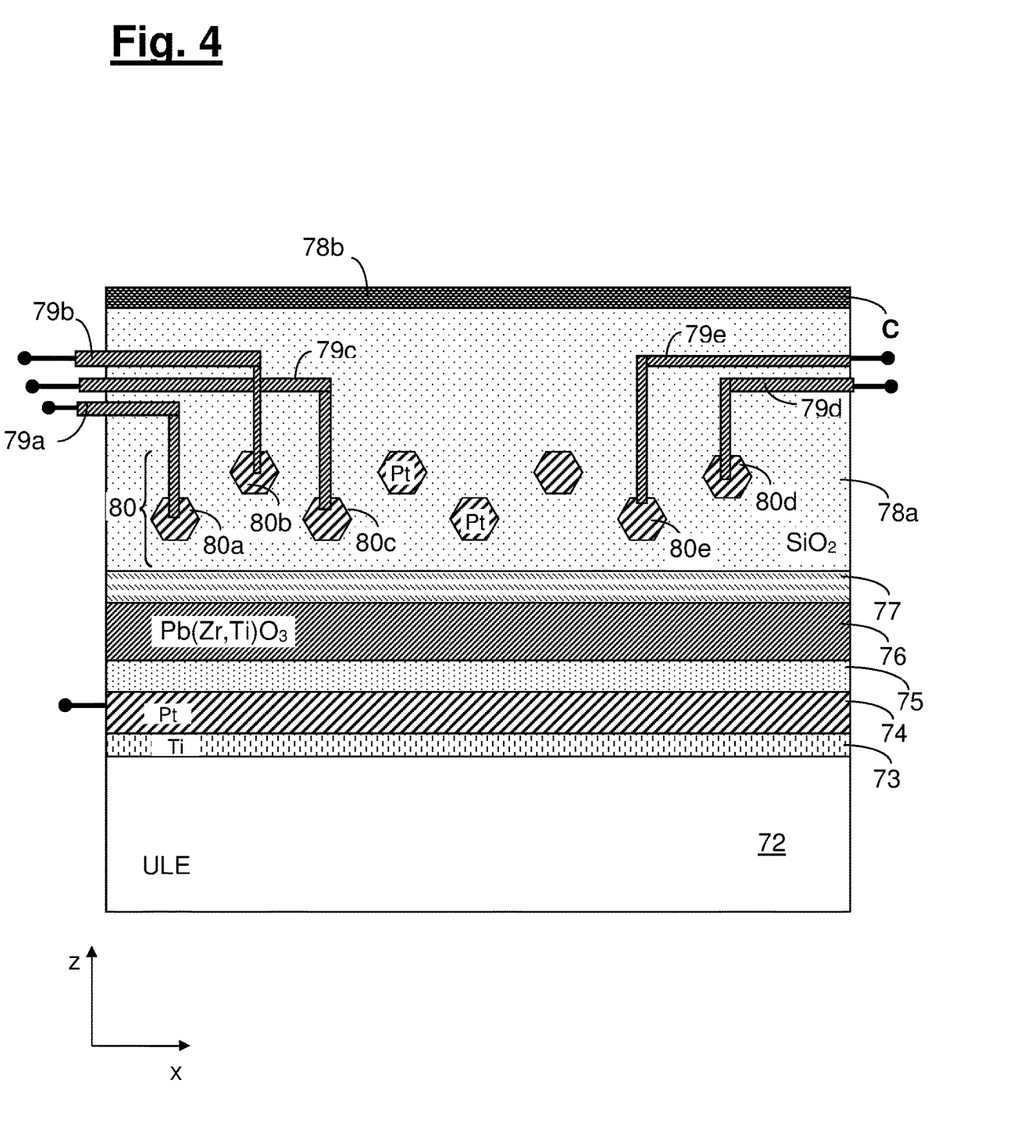
FIG. 4 shows a schematic illustration for describing one possible method for producing a mirror according to the invention.

FIG. 4 shows a schematic illustration for describing one possible method for producing a mirror in accordance with a further embodiment of the invention. This embodiment differs from those described above in that during the fabrication process a sacrificial layer 78b composed of e.g. carbon (C) is applied to the quartz ($SiO_2$) layer 78a for the purpose and for the duration of the interferometric measurement and is removed again in each case after this measurement, whereupon in each case a new step of the surface processing can be carried out. In this case, the thickness of said sacrificial layer 78b composed of carbon (C) can be e.g. 35 nm. Even though the sacrificial layer 78b composed of carbon (C) applied in each case for the purpose and for the duration of the interferometric measurement need no longer be present in the finished produced mirror, the present invention is also intended to encompass embodiments in which the sacrificial layer 78b composed of carbon (C) is finally left in the layer construction of the mirror.

Figure 5:
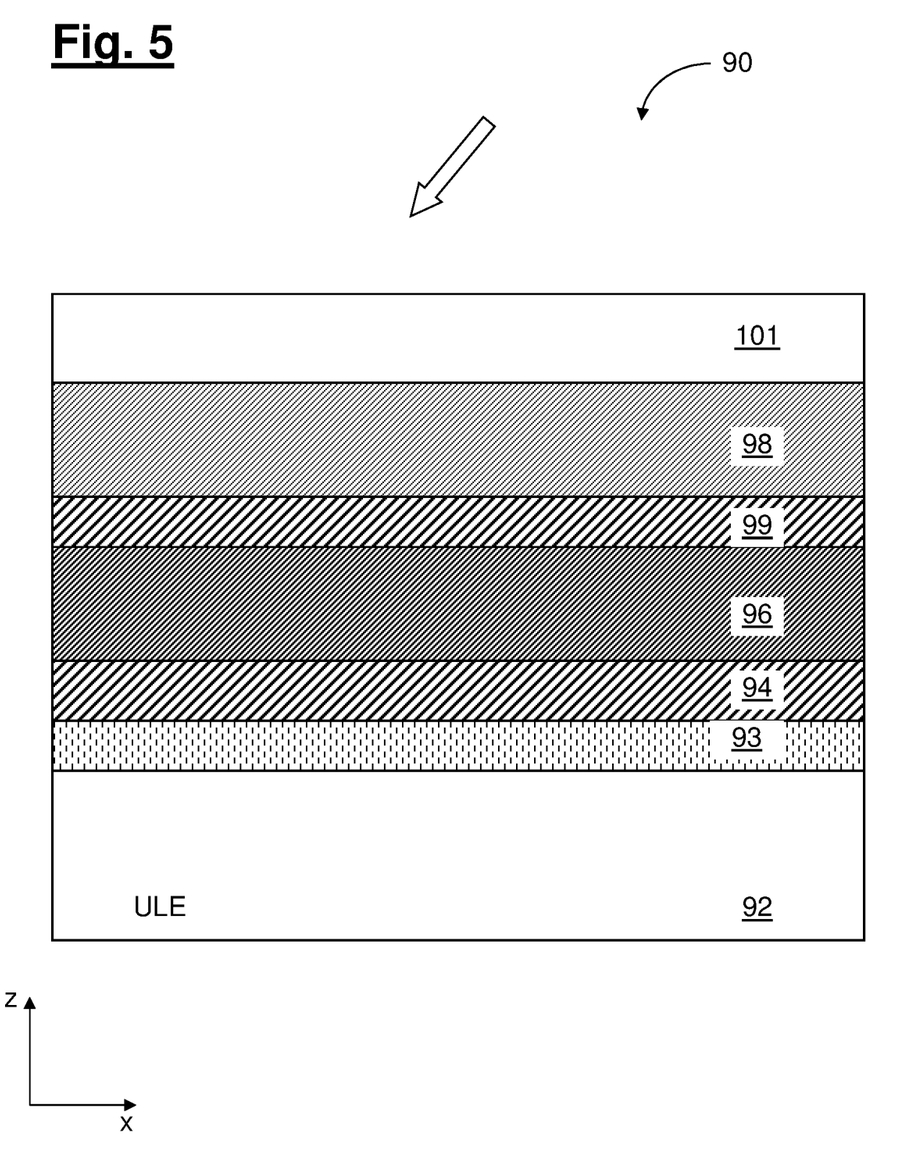
FIGS. 5, 6A, 6B and 7 show schematic illustrations for describing a further embodiment of the invention.

FIG. 5 shows a further possible embodiment of the invention in a schematic illustration. The layer construction illustrated schematically in FIG. 5 firstly comprises, analogously to the embodiments described above, a mirror substrate 92, a buffer layer 93, a piezoelectric layer 96 situated between electrode arrangements 94, 99, and a reflection layer stack 101.

The embodiment in FIG. 5 takes account, then, of the problem that in practice an undesired reduction of the $d_{33}$ coefficient occurs, which coefficient describes that component of the dielectric tensor which is responsible for the linear expansion depending on the electrical voltage applied to the piezoelectric layer 96 in a direction perpendicular to the optical effective surface. This problem is caused by a sinking of the piezoelectric layer into the mirror substrate that occurs upon voltage being applied to the electrodes and accompanies a transverse contraction. This effect is manifested primarily in the case of soft, non-stiff mirror substrate materials (having a low modulus of elasticity) and ultimately has the undesired consequence that there is a significant decrease in the expansion of the piezoelectric layer that is effectively usable for the deformation of the optical effective surface of the mirror in a direction perpendicular to the optical effective surface.

Figure 6A:
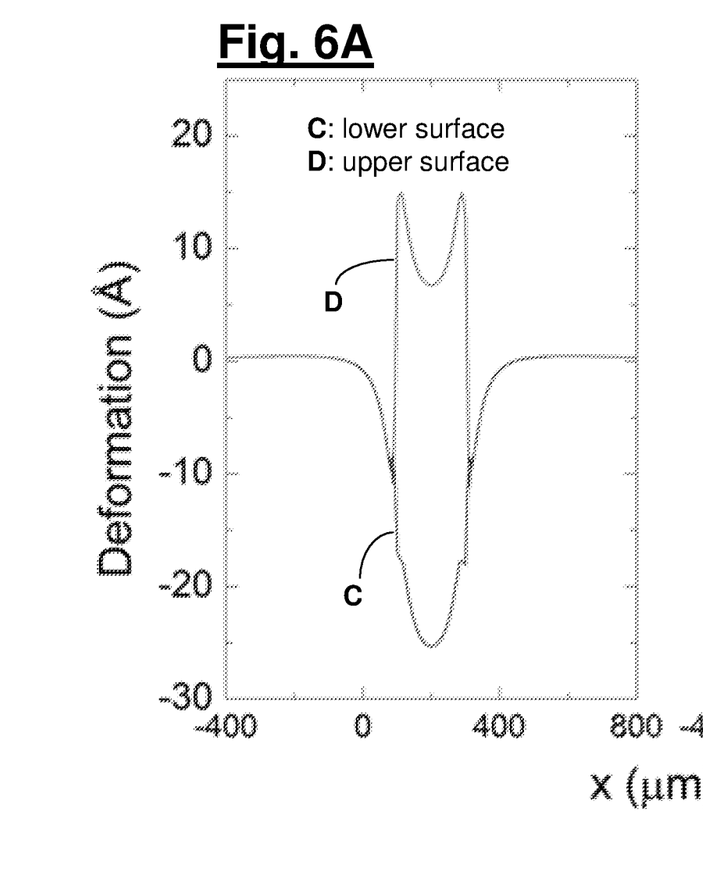
Figure 6B:
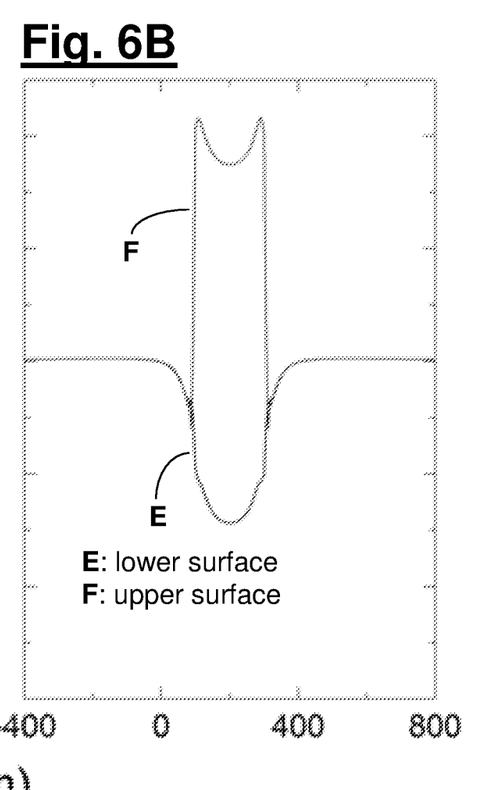

FIGS. 6A and 6B show diagrams with corresponding simulation results for different substrate materials, wherein the curves "C" and "E" indicate that deformation of the piezoelectric layer which occurs in each case for the underside (i.e. the side facing the substrate) for a quartz substrate (FIG. 6A) and for a silicon substrate (FIG. 6B), respectively, and wherein the curves "D" and "F" indicate that deformation of the piezoelectric layer which occurs in each case for the top side (i.e. the side facing away from the substrate).

In order to counteract this effect, a mirror according to the invention, in the construction illustrated schematically in FIG. 5, comprises a bracing layer 98 arranged on that side of the piezoelectric layer 96 or of the electrode arrangement 99 which faces the reflection layer stack 101. Said bracing layer 98 can be produced from a material such as quartz glass ($SiO_2$), for example, which has a value of the modulus of elasticity (Young's modulus) comparable with that of the material of the mirror substrate 92. In this way, a compensation effect (comprehensible illustratively by virtue of the construction mirrored with regard to the sinking effect described above) can be achieved with the consequence that the effective deflection of the piezoelectric layer 96 is increased. For a significant compensation effect, the bracing layer 98 can have e.g. a thickness of the order of magnitude of 30 μm.

Figure 7:
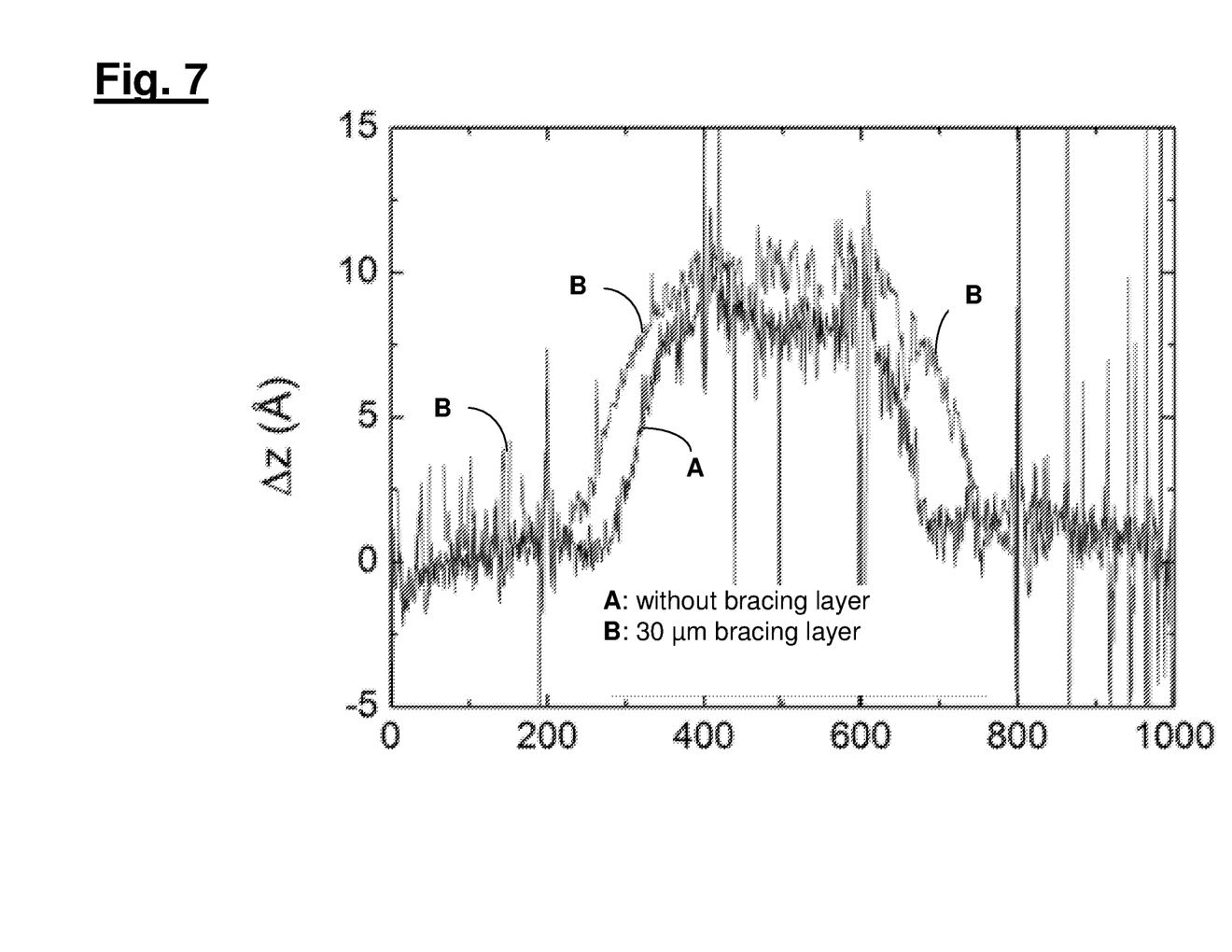

FIG. 7 shows a diagram illustrating the effect of a bracing layer having a thickness of 30 μm on the effective deflection of the piezoelectric layer by comparison with a mirror without the bracing layer.

The above-described compensation effect as a result of the bracing layer 98 can also be achieved in combination with the above-described effects of the multifunctional layer system according to the invention.

Figure 9:
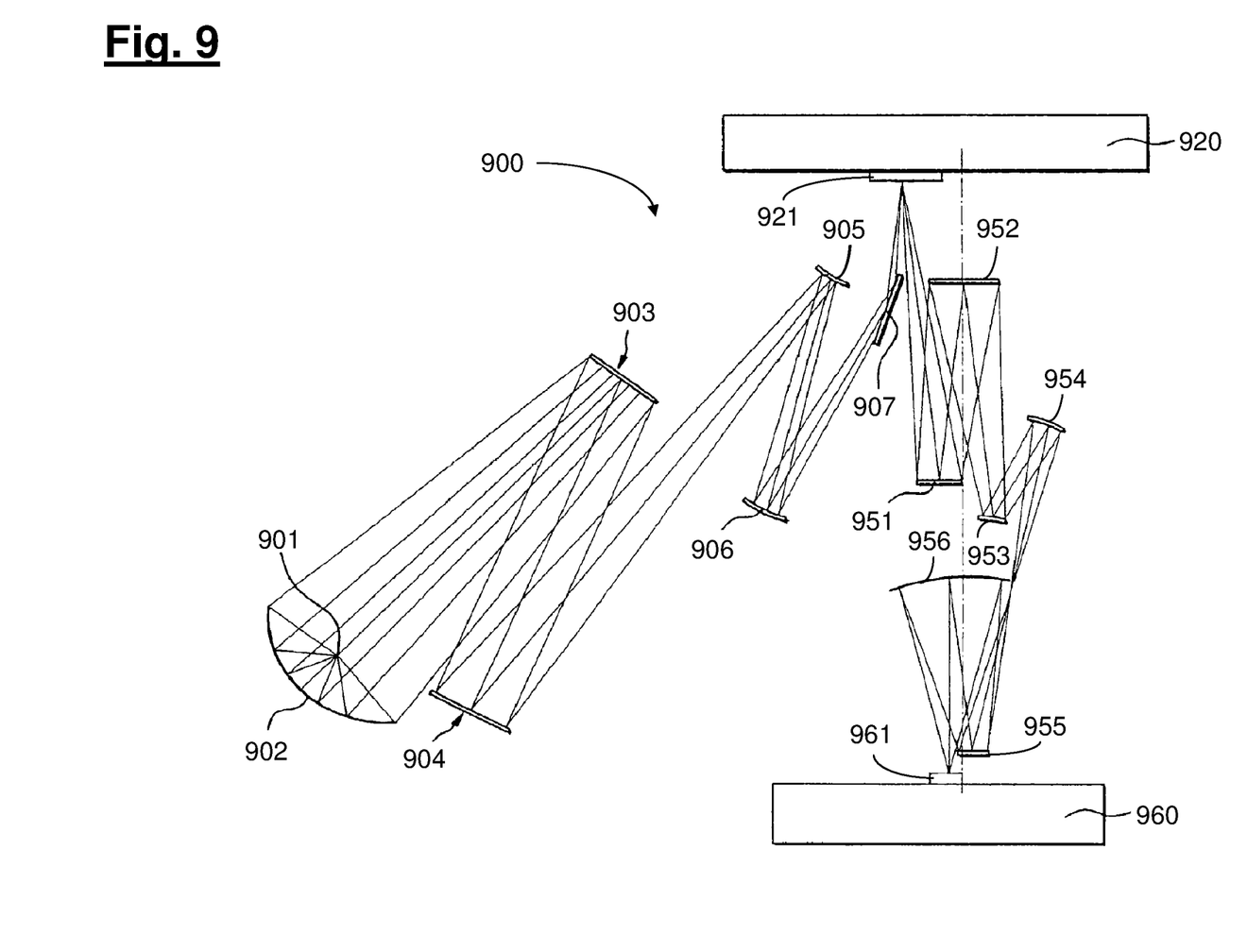
FIG. 9 shows a schematic illustration of the construction of a microlithographic projection exposure apparatus designed for operation in the EUV.

FIG. 9 shows a schematic illustration of an exemplary projection exposure apparatus which is designed for operation in the EUV and in which the present invention can be realized. In accordance with FIG. 9, an illumination device in a projection exposure apparatus 900 designed for EUV comprises a field facet mirror 903 and a pupil facet mirror 904. The light from a light source unit comprising a plasma light source 901 and a collector mirror 902 is directed onto the field facet mirror 903. A first telescope mirror 905 and a second telescope mirror 906 are arranged in the light path downstream of the pupil facet mirror 904. A deflection mirror 907 is arranged downstream in the light path, said deflection mirror directing the radiation that is incident thereon onto an object field in the object plane of a projection lens comprising six mirrors 951-956. At the location of the object field, a reflective structure-bearing mask 921 is arranged on a mask stage 920, said mask being imaged with the aid of the projection lens into an image plane in which a substrate 961 coated with a light-sensitive layer (photoresist) is situated on a wafer stage 960.

Of the mirrors 951-956 of the projection lens, it is in particular the mirrors 951 and 952—arranged in the initial area of the projection lens with respect to the optical beam path—that can be configured in the manner according to the invention. This is so because the achieved effect of compensating for thermal deformations is then particularly pronounced as a result of the accumulated reflection losses at said mirrors 951, 952 still being comparatively low, which, in turn, results in relatively high light intensities.

Although the invention has been described with reference to specific embodiments, numerous variations and alternative embodiments will be apparent to the person skilled in the art, for example through combination and/or exchange of features of individual embodiments. Accordingly, such variations and alternative embodiments are also encompassed by the present invention, and the scope of the invention is restricted only within the meaning of the appended claims and the equivalents thereof.

What is claimed is:

1. A mirror, wherein the mirror has an optical effective surface, comprising
a mirror substrate;
a reflection layer stack configured to reflect electromagnetic radiation having an operating wavelength that is incident on the optical effective surface;
at least one piezoelectric layer, which is arranged between the mirror substrate and the reflection layer stack and configured to receive an electric field that produces a locally variable deformation applied by way of a first electrode arrangement situated on a side of the piezoelectric layer facing the reflection layer stack, and by way of a second electrode arrangement situated on a side of the piezoelectric layer facing the mirror substrate; and
a bracing layer, which reduces a sinking of the piezoelectric layer into the mirror substrate that accompanies application of the electric field in comparison with a mirror constructed analogously but without the bracing layer, and which thus increases an effective deflection of the piezoelectric layer in comparison with the analogously constructed mirror;
wherein the bracing layer has a thickness of at least 15 μm.

2. The mirror as claimed in claim 1, wherein the bracing layer comprises quartz glass ($SiO_2$).

3. The mirror as claimed in claim 1 claim 1, wherein the bracing layer has a thickness of at least 30 µm.

4. The mirror as claimed in claim 1, further comprising a multifunctional layer system into which the first electrode arrangement is embedded, which is configured for a smoothing surface processing, and which has a transmission of less than $10^{-6}$ for electromagnetic radiation having a test wavelength in order to enable a surface-interferometric measurement.

5. An optical system of a microlithographic projection exposure apparatus, wherein the optical system comprises a mirror as claimed in claim 1.

6. A microlithographic projection exposure apparatus comprising an illumination device and a projection lens, wherein the projection exposure apparatus comprises an optical system as claimed in claim 5.

7. A mirror, wherein the mirror has an optical effective surface, comprising
a mirror substrate;
a reflection layer stack configured to reflect electromagnetic radiation having an operating wavelength that is incident on the optical effective surface; and
at least one piezoelectric layer, which is arranged between the mirror substrate and the reflection layer stack and configured to receive an electric field that produces a locally variable deformation applied by way of a first electrode arrangement situated on a side of the piezoelectric layer facing the reflection layer stack, and by way of a second electrode arrangement situated on a side of the piezoelectric layer facing the mirror substrate; and
a multifunctional layer system, into which the first electrode arrangement is embedded, which is configured for a smoothing surface processing, and which has a transmission of less than $10^{-6}$ for electromagnetic radiation having a test wavelength in order to enable a surface-interferometric measurement;
wherein the multifunctional layer system comprises a layer composed of doped quartz glass ($SiO_2$).

8. The mirror as claimed in claim 7, wherein the multifunctional layer system has a transmission of less than $10^{-7}$ for electromagnetic radiation having the test wavelength.

9. The mirror as claimed in claim 7, wherein the multifunctional layer system has a transmission of less than $10^{-9}$ for electromagnetic radiation having the test wavelength.

10. The mirror as claimed in claim 7, wherein the multifunctional layer system further comprises a layer composed of amorphous silicon (a-Si).

11. The mirror as claimed in claim 7 and configured for an operating wavelength of less than 30 nm.

12. The mirror as claimed in claim 7 and configured for operation in a microlithographic projection exposure apparatus.

13. A method for producing a mirror, comprising:
providing a mirror substrate;
applying a piezoelectric layer and a first and a second electrode arrangement on the mirror substrate;
applying an electric field that produces a locally variable deformation to the piezoelectric layer by way of the first electrode arrangement situated on a side of the piezoelectric layer facing away from the mirror substrate, and by way of the second electrode arrangement situated on a side of the piezoelectric layer facing the mirror substrate;
wherein the first electrode arrangement is embedded in a multifunctional layer system, which firstly enables a smoothing surface processing and secondly has a transmission of less than $10^{-6}$ for electromagnetic radiation having a test wavelength, in order to enable a surface-interferometric measurement; and
applying a reflection layer stack that reflects electromagnetic radiation having an operating wavelength that is incident on an optical effective surface provided by the reflection layer stack;
wherein the multifunctional layer system comprises a layer composed of doped quartz glass ($SiO_2$).

14. The method as claimed in claim 13, wherein the multifunctional layer system has a transmission of less than $10^{-7}$ for electromagnetic radiation having the test wavelength.

15. The method as claimed in claim 13, wherein the multifunctional layer system further comprises a sacrificial layer.

16. The method as claimed in claim 15, further comprising removing the sacrificial layer in each case before the reflection layer stack is applied.

17. The method as claimed in claim 15, wherein the sacrificial layer is removed after a surface-interferometric measurement is respectively carried out.

18. The method as claimed in claim 13, wherein the multifunctional layer system further comprises a layer composed of amorphous silicon (a-Si).

19. A method for producing a mirror, comprising:
providing a mirror substrate;
applying a piezoelectric layer and a first and a second electrode arrangement on the mirror substrate;
applying an electric field that produces a locally variable deformation to the piezoelectric layer by way of the first electrode arrangement situated on a side of the piezoelectric layer facing away from the mirror substrate, and by way of the second electrode arrangement situated on a side of the piezoelectric layer facing the mirror substrate;
wherein the first electrode arrangement is embedded in a multifunctional layer system, which firstly enables a smoothing surface processing and secondly has a transmission of less than $10^{-6}$ for electromagnetic radiation having a test wavelength, in order to enable a surface-interferometric measurement; and
applying a reflection layer stack that reflects electromagnetic radiation having an operating wavelength that is incident on an optical effective surface provided by the reflection layer stack, wherein the multifunctional layer system comprises a sacrificial layer; and
removing the sacrificial layer in each case before the reflection layer stack is applied.

20. The method as claimed in claim 19, wherein the multifunctional layer system further comprises a layer composed of quartz glass ($SiO_2$).

* * * * *